United States Patent
Chang et al.

(10) Patent No.: US 10,861,970 B1
(45) Date of Patent: Dec. 8, 2020

(54) SEMICONDUCTOR EPITAXIAL STRUCTURE WITH REDUCED DEFECTS

(71) Applicant: UNITED MICROELECTRONICS CORP., Hsin-Chu (TW)

(72) Inventors: Chun-Ming Chang, Kaohsiung (TW); Chun-Liang Hou, Hsinchu County (TW); Wen-Jung Liao, Hsinchu (TW); Ming-Chang Lu, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/596,773

(22) Filed: Oct. 9, 2019

(30) Foreign Application Priority Data

Sep. 12, 2019 (CN) .......................... 2019 1 0862592

(51) Int. Cl.
*H01L 29/20* (2006.01)
*H01L 29/78* (2006.01)
*H01L 29/66* (2006.01)
*H01L 29/778* (2006.01)

(52) U.S. Cl.
CPC ...... *H01L 29/7846* (2013.01); *H01L 29/2003* (2013.01); *H01L 29/66462* (2013.01); *H01L 29/7787* (2013.01)

(58) Field of Classification Search
CPC ............. H01L 29/7846; H01L 29/2003; H01L 29/7787
USPC ......................................................... 257/194
See application file for complete search history.

(56) References Cited

FOREIGN PATENT DOCUMENTS

EP 2302681 4/2017

*Primary Examiner* — Elias Ullah
(74) *Attorney, Agent, or Firm* — Winston Hsu (57) ABSTRACT

A semiconductor epitaxial structure with reduced defects, including a substrate with a recess formed thereon, an island insulator on a bottom surface of the recess, spacers on sidewalls of the recess, a buffer layer in the recess and covering the island insulator, a channel layer in the recess and on the buffer layer, and a barrier layer in the recess and on the channel layer, wherein two-dimensional electron gas (2DEG) or two-dimensional hole gas (2DHG) is formed in the channel layer.

20 Claims, 5 Drawing Sheets

SEMICONDUCTOR EPITAXIAL STRUCTURE WITH REDUCED DEFECTS

BACKGROUND OF THE INVENTION

1. Field of the Invention

The present invention generally relates to a semiconductor epitaxial structure, and more specifically, to a semiconductor epitaxial structure with two-dimensional electron gas (2DEG) or two-dimensional hole gas (2DHG) and reduced defects.

2. Description of the Prior Art

The ability of GaN to form heterojunctions makes it a superior material to be used to fabricate high electron mobility transistors (HEMT) or high hole mobility transistors (HHMT). The advantages of these transistors include their high carrier concentration and their higher carrier mobility due to reduced ionized impurity scattering. The combination of high carrier concentration and high carrier mobility results in the characteristics of high current density and low channel resistance, which are especially important for high frequency operation and power switching applications.

In the depletion mode (D-mode) of high electron mobility transistor, the electric field generated by gate electrode is used to deplete a two dimensional electron gas (2DEG) channel at interface of wide energy band gap and narrow energy band gap of semiconductor, such as an interface between aluminum nitride/gallium nitride (AlN/GaN) or between aluminum gallium nitride/gallium nitride (AlGaN/GaN). A control voltage can be applied to the gate electrode to directly affect and control the amount of current flowing through the channel. The depletion mode transistors function as "normally-on" devices when used as switches. For an HEMT in enhancement mode (E-mode), no channel is present and no current flow occurs until the transistor is biased for operation. In particular, the transistor is biased and a voltage is applied to the gate electrode in order to move the 2DEG channel below the Fermi level. Once another voltage is applied between the source and drain, the electrons in the 2DEG channel would move from source to drain. The enhancement mode transistors are generally used in digital and analog integrated circuits (ICs) and can function as "normally-off" devices. Enhancement mode HEMTs are also useful for analog circuit applications, such as RF/microwave power amplifiers or switches.

Nevertheless, the aforementioned high electron mobility transistors (HEMT) or high hole mobility transistors (HHMT) are usually made of epitaxial multilayer. This epitaxial multilayer is prone to high stress and defect issues, and its device properties are substantially affected by the quality of epitaxial structure. Accordingly, there is still a need in relevant field and industry for improving the structure and method for fabricating these devices.

SUMMARY OF THE INVENTION

In view of the aforementioned defect issue prone to occur in the epitaxial structure in conventional skill, the present invention hereby provides a semiconductor epitaxial structure with reduced defects, which is characterized by using selective epitaxial growth to reduce stress and defects, and is provided with an island insulator disposed therein to further improve lateral breakdown voltage and spacers to insulate the device in anti-mesa fashion.

One aspect of the present invention is to provide a semiconductor epitaxial structure with reduced defects, including a substrate with a recess formed thereon, an island insulator disposed on a bottom surface of the recess, spacers disposed on sidewalls of the recess, a buffer layer disposed in the recess and covering the island insulator, a channel layer disposed in the recess and on the buffer layer, and a barrier layer disposed in the recess and on the channel layer, wherein the barrier layer, the channel layer and the buffer layer are all surrounded by the spacers, and a two-dimensional electron gas (2DEG) or a two-dimensional hole gas (2DHG) is formed in the channel layer.

Another aspect of the present invention is to provide a semiconductor epitaxial structure with reduced defects, including a silicon substrate, an isolating layer disposed on the substrate, wherein the isolating layer has a recess exposing the substrate, an island insulator disposed on the substrate in the recess, spacers disposed on sidewalls of the recess, a buffer layer disposed in the recess and covering the island insulator, a channel layer disposed in the recess and on the buffer layer, and a barrier layer disposed in the recess and on the channel layer, wherein the barrier layer, the channel layer and the buffer layer are all surrounded by the spacers, and a two-dimensional electron gas (2DEG) or a two-dimensional hole gas (2DHG) is formed in the channel layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

Figure 1:
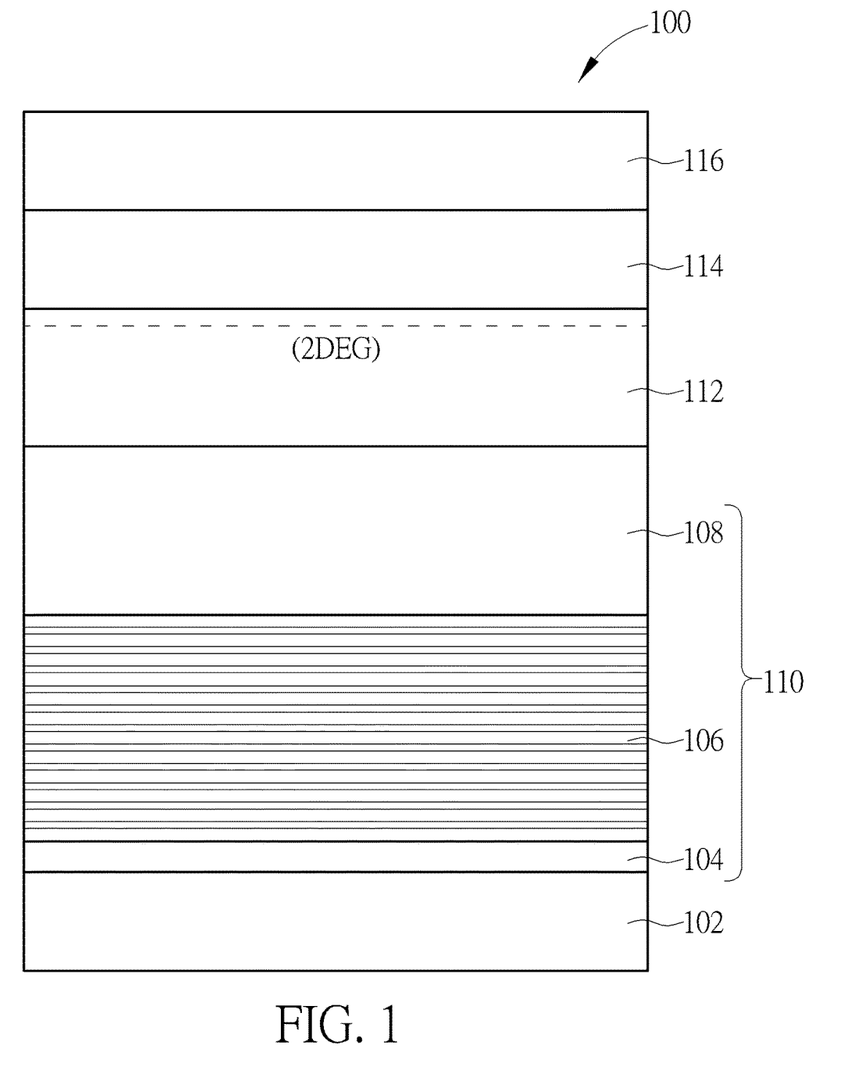
FIG. 1 is a cross-section illustrating detailed layer structure of the semiconductor epitaxial structure in accordance with the embodiment of present invention.
Figure 2:
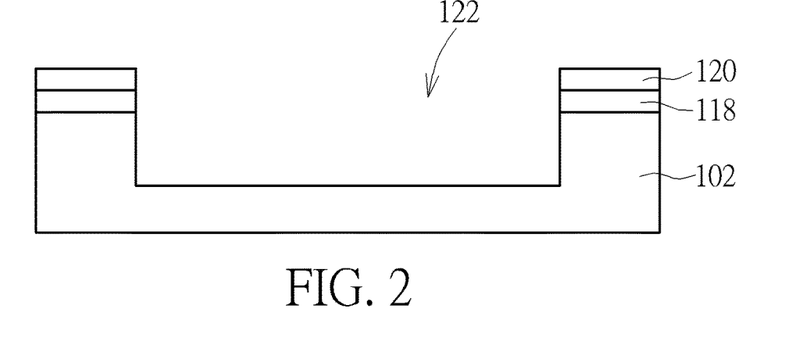
FIGS. 2-6 are schematic cross-sections illustrating steps of fabricating the semiconductor epitaxial structure in accordance with the embodiment of present invention.

The semiconductor epitaxial structure and method of fabricating the same will be hereinafter described according to the embodiment of present invention, wherein FIG. 1 illustrates detailed layer structure of the semiconductor epitaxial structure 100, and FIGS. 2-6 illustrate the process flow of fabricating the semiconductor epitaxial structure 100.

Please refer to FIG. 1. First, a substrate 102 is provided. The substrate 102 may be made of silicon (Si) or other semiconductor materials. In some embodiments, the substrate 102 is a silicon wafer with a silicon layer in <111> lattice form. The Si <111> layer may provide optimal lattice match with overlying layers, such as a gallium nitride (GaN) layer or a superlattice layer. In some embodiments, the substrate 102 layer may be made of a compound semiconductor such as silicon carbide (SiC), gallium arsenic (GaAs), indium arsenide (InAs), or indium phosphide (InP). In some embodiments, the substrate 102 is made of an alloy semiconductor such as silicon germanium, silicon germanium carbide, gallium arsenic phosphide, or gallium indium phosphide.

A nucleation layer 104 is formed on the substrate 102. In the embodiment of present invention, the nucleation layer 104 is used to compensate the mismatch of lattice structures and/or coefficients of thermal expansion between the substrate 102 and overlying structures in order to provide better foundation for epitaxial growth. In some embodiments, materials of the nucleation layer 104 may be aluminum nitride (AlN). The lattice structure of nucleation layer 104 may change gradually to achieve a gradual transition of the lattice structures and/or coefficients of thermal expansion between the substrate 102 and overlying structures. For example, in some embodiments, the nucleation layer 104 includes aluminum gallium nitride with composition gradient, wherein X is composition ratio of aluminum in $Al_xGa_{1-x}N$, and X is from 0 to 1. Preferably, X is gradually decreased from a bottom surface adjacent to nucleation layer 104 to a top surface.

Refer again to FIG. 1. A superlattice stack 106, such as alternating aluminum gallium nitride layers and gallium nitride layers (AlGaN/GaN) or alternating aluminum gallium nitride layers and indium gallium nitride (AlGaN/InGaN) layers, is formed on the nucleation layer 104. In the embodiment of present invention, the function of super lattice stack 106 is that it can offset vertical stress generated during epitaxial growth of the layer structures of 3D semiconductor structure through the horizontal strain generated by super lattice stack, thereby preventing defects such as dislocation and break that may impact the quality of the layer structures.

A carbon-doped GaN layer 108 is formed on the superlattice stack 106. In the embodiment of present invention, the presence of carbon-doped GaN layer 108 may significantly increase the breakdown voltage and reduce vertical current leakage of devices that is made of semiconductor epitaxial structure 100. The more the thickness of the carbon-doped GaN layer 108, the better its efficiency.

In the embodiment above, the nucleation layer 104, the superlattice stack 106 and the carbon-doped GaN layer 108 may belong to a portion of the buffer layer 110 in the semiconductor epitaxial structure 100. They gradually change the mismatch state of the lattice structures and coefficients of thermal expansion between substrate 102 and overlying epitaxial structures, thereby improving the electrical property of the fabricated device.

Refer again to FIG. 1. A channel layer 112 is formed on the buffer layer 110. In the embodiment of present invention, the resistivity of channel layer 112 is lower than the resistivity of buffer layer 110, so that the fabricated device will have better current performance. In some embodiments, the channel layer 112 includes one or more group III-V compound semiconductor layers. Examples of this group III-V compound semiconductor include but not limited to gallium nitride (GaN), aluminum gallium nitride (AlGaN), Indium gallium nitride (InGaN) and Indium aluminum gallium nitride (InAlGaN), especially undoped GaN layer.

A barrier layer 114 is formed on the channel layer 112. In the embodiment of present invention, the barrier layer 114 is disposed to form a heterojunction with the channel layer 112 and form a bandgap discontinuity therebetween. In some embodiments, the bandgap of doped barrier layer 114 is larger than the bandgap of channel layer 112. Electrons generated in the barrier layer 114 by piezoelectric polarization will fall into the channel layer 112, thereby forming a film with high electron mobility and conductivity characteristics. That is two dimension electron gas (2DEG) in the channel layer 112, which is near the interface with adjacent barrier layer 114. In the case of n-type semiconductor, electrons in the two dimension electron gas will be the charge carriers in the channel layer 112. High electron mobility transistors (HEMT) can be fabricated by forming the structures like gate and source/drain on the barrier layer 114 in later process. In other embodiment, such as in the case that the barrier layer 114 and the channel layer 112 are doped with p-type dopants like carbon (C), iron (Fe), magnesium (Mg) or Zinc (Zn), the charge carriers formed between the barrier layer 114 and the channel layer 112 will be two dimension hole gas (2DHG). High hole mobility transistors (HHMT) can be fabricated by the structures like forming gate and source/drain on the barrier layer 114 in later process. High electron mobility transistors (HEMT) and high hole mobility transistors (HHMT) are a kind of field effect transistor, which combines the materials with different bandgaps to form junction (i.e. heterojunctions) therebetween as channels, rather than using normal doped regions as channels like those in metal-oxide-semiconductor field-effect transistors (MOSFETs).

Following the aforementioned embodiment, due to the naturally occurring of two dimensional electron gas (2DEG) as charge carriers without the presence of gate structure, the transistor formed by these structures (e.g. HEMT) would be conductive without the application of a voltage to the gate electrode. Therefore, this transistor would be a normally-ON device in a negative threshold voltage. Such a normally-ON state would be a design concern in power applications where it is desirable to prevent, or substantially inhibit, the current from flowing in or through the transistor. In some embodiments, in order to convert a normally-ON HEMT device to a normally-OFF HEMT device, a gate layer 116 will be formed over the barrier layer 114 to deplete the two dimensional electron gas under the gate structure and form a normally-OFF channel. In the embodiment of present invention, the material of gate layer 116 includes but not limited to p-type doped GaN.

The layers described in the embodiments above may be formed by epitaxial growth process. Example of this process includes but not limited to metal organic chemical-vapor deposition (MOCVD), molecular beam epitaxy (MBE) and hydride vapour phase epitaxy (HVPE), etc. The layers described in the embodiments above may also be in-situ formed in the same process chamber without changing process chambers, thereby saving the process cost and reducing pollution.

Please refer to FIGS. 2-6. After the description about detailed layer structure of the semiconductor epitaxial structure in the present invention, the fabrication process of the semiconductor epitaxial structure 100 will now be described in following embodiment. First, please refer to FIG. 1. Similarly, a silicon substrate 102 is provided. A photolithography process is performed by using a patterned photoresist 120 and a hard mask 118 to form a recess 122 on the silicon substrate 102. In the embodiment of present invention, the purpose of forming recess 122 is to selectively and designedly confine the epitaxial structure formed only in the recess 122. This is quite different from the approach of blanket-type epitaxial growth on entire substrate in conventional skill.

Figure 3:
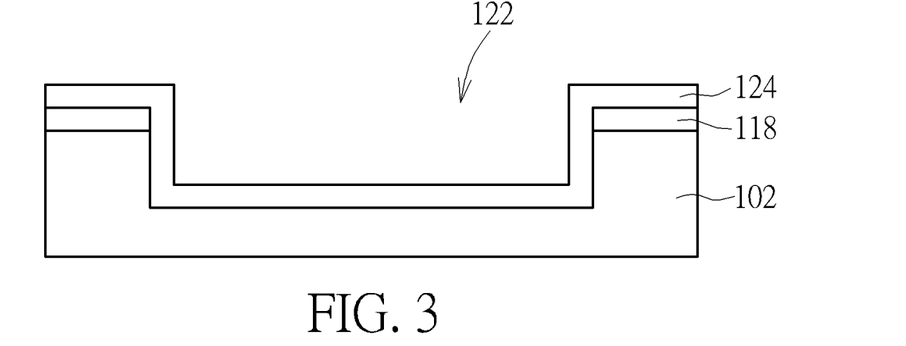

Next, please refer to FIG. 3. After the recess 122 is formed, the photoresist 120 is removed and a silicon oxide layer 124 is formed on entire substrate 102, including the recess 122. In the embodiment of present invention, the silicon oxide layer 124 is provided to form island insulators and spacer structures in later processes. The silicon oxide layer 124 may be formed by conventional deposition processes, including chemical vapor deposition (CVD), physical vapor deposition (PVD), atomic layer deposition (ALD), high density plasma CVD (HDPCVD), metal organic CVD (MOCVD), plasma enhanced CVD (PECVD), or other applicable processes.

Figure 4:
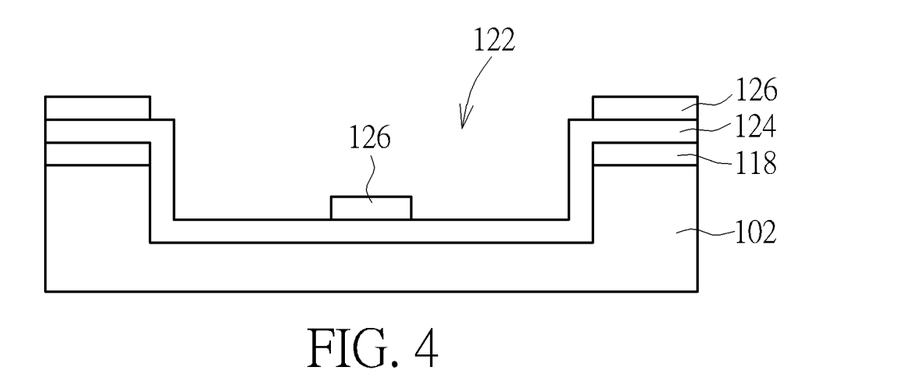

Next, please refer to FIG. 4. After the silicon oxide layer 124 is formed, another patterned photoresist 126 is formed on the silicon oxide layer 124. As shown in FIG. 4, a portion of the photoresist 126 is formed on the silicon oxide layer 124 in the recess 122 to define the shape and position of island insulators that will be formed in later processes, while other portions of the photoresist 126 are formed on the silicon oxide layer 124 outside the recess 122. Please note that, in order to fabricate the spacer structures, these portions of the photoresist 126 don't cover the silicon oxide layer 124 on sidewalls of the recess 122.

Figure 5:
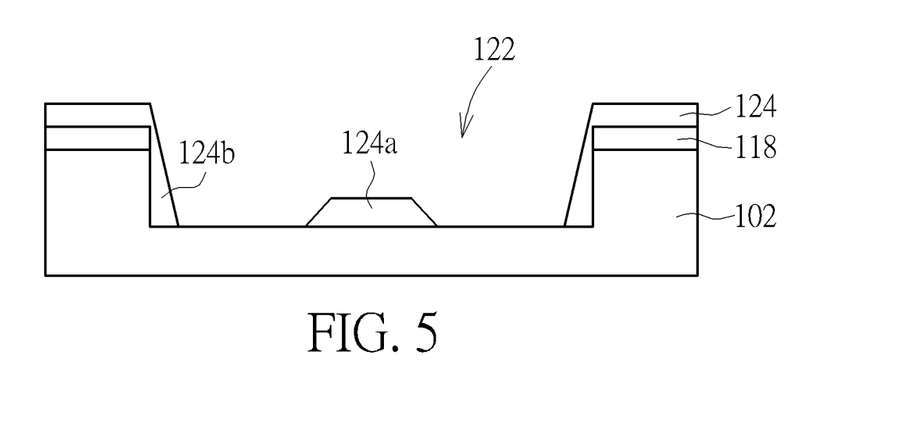

Next, please refer to FIG. 5. After the photoresist 126 is formed, an etch process is performed to remove the silicon oxide layer 124 not covered by the photoresist 126. In this way, a predetermined island insulator 124a will be formed on the middle of the bottom surface of recess 122, and a portion of silicon oxide layer 124 will remain on sidewalls of the recess 122 in a spacer form. Please note that in the embodiment of present invention, the parameter of etch process is tuned to make the etch process with slight isotropic characteristic, so that the island insulator 124a and the spacers 124b formed by this etch process will have feature tapering upwardly from the substrate 102. The efficacy of this feature will be detailed in following embodiments.

Figure 6:
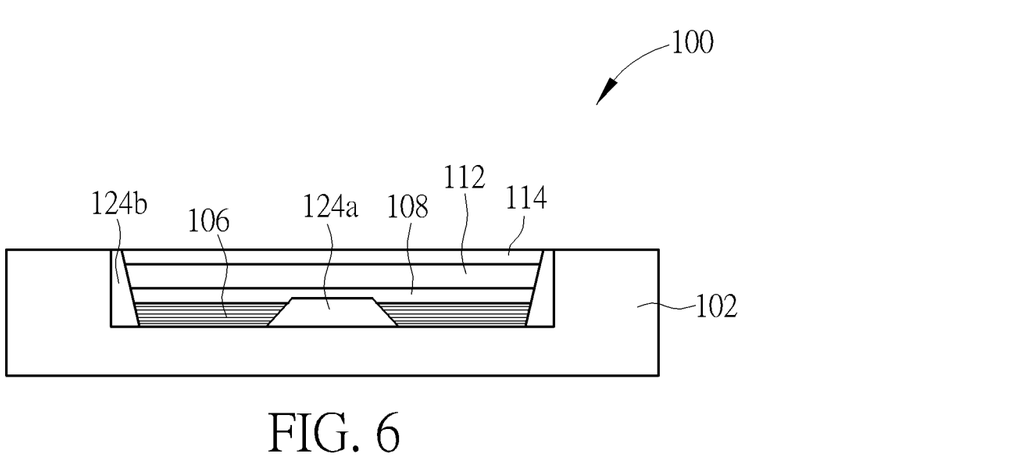

Next, please refer to FIG. 6. After the island insulator 124a and the spacer are formed, layer structures such as buffer layer 110, channel layer 112 and barrier layer 114 are formed sequentially in the recess 122 on the substrate, just like the embodiment of FIG. 1. For the simplicity and clarity of drawings, the figure will only show the superlattice stack 106 and the carbon-doped GaN layer 108 among the sub-layers of aforementioned buffer layer 110, and the gate layer 116 will not be shown. Wherein the superlattice stack 106 is formed surrounding the island insulator 124a, while the carbon-doped GaN layer 108 covers over entire island insulator 124a and the superlattice stack 106. These layers may be in-situ formed by epitaxial growth processes in the same process chamber. Example of these processes includes but not limited to metal organic chemical-vapor deposition (MOCVD), molecular beam epitaxy (MBE) and hydride vapour phase epitaxy (HVPE), etc. On the other hand, in the embodiment of present invention, since sidewalls of the recess 122 are covered by spacer 124b, the buffer layer, the channel layer 112 and the barrier layer 114 are all surrounded by the spacer 124b. Lastly, remove the hard mask 118 and silicon oxide layer 124 outside the recess, so that the fabrication of semiconductor epitaxial structure 100 is completed. In real fabrication process, circuit structures such as gates, sources/drains, contacts and/or metal wirings may be formed on the semiconductor epitaxial structure 100 to constitute high electron mobility transistors (HEMT) or high hole mobility transistors (HHMT). Since these processes are not key point of the present invention, relevant detail is herein omitted.

In the embodiment of present invention, the island insulator 124a and spacer 124b with tapering features may increase lateral breakdown voltage of entire epitaxial structure. For example, in the case that compressive stress is generated by the mismatch of lattice structures or coefficients of thermal expansion in entire epitaxial structure, the upwardly-tapering island insulator 124a and spacer 124b offset the lateral compressive stress from the epitaxial stack, so that fewer defects will be formed and grown in the epitaxial stack and the quality of the layer structures is thereby improved, especially for the superlattice stack 106 at two sides of the island insulator 124a. Since the island insulator 124a is positioned in the middle of the superlattice stack 106, the original effect of stress releasing through the superlattice stack 106 at two sides of the island insulator 124a may be further improved and promised. On the other hand, since the epitaxial stacks are selectively formed in individual recesses in a small area fashion, compared to the blanket deposition on entire substrate in conventional skill, this approach will not accumulate massive stress during the epitaxial growth, so that conventional epitaxial stress issue may be further mitigated. Moreover, in the embodiment of present invention, the process of forming island insulator 124a and spacer 124b is quite simple, and the selective epitaxial growth may also save more process cost.

On the other hand, in the present invention, the cooperation of recess 122 and spacer 124b may achieve the efficacy of device isolation in an anti-mesa fashion. Conventionally, semiconductor devices are usually isolated in mesa isolation fashion, i.e., with steps of separating devices/transistors by photolithography process and filling up isolating materials such as shallow trench isolations (STI) between devices to provide the effect of electrical isolation. The approach of present invention utilizes recess feature in the selective epitaxial growth process to form spacer 124b with isolating property on sidewalls of the recess 122. In comparison to conventional mesa type isolation, this approach not only achieves the purpose of device isolation, but also provides outstanding planarization characteristic. To summary up, the present invention provides a novel semiconductor epitaxial structure with those aforementioned advantages.

Figure 7:
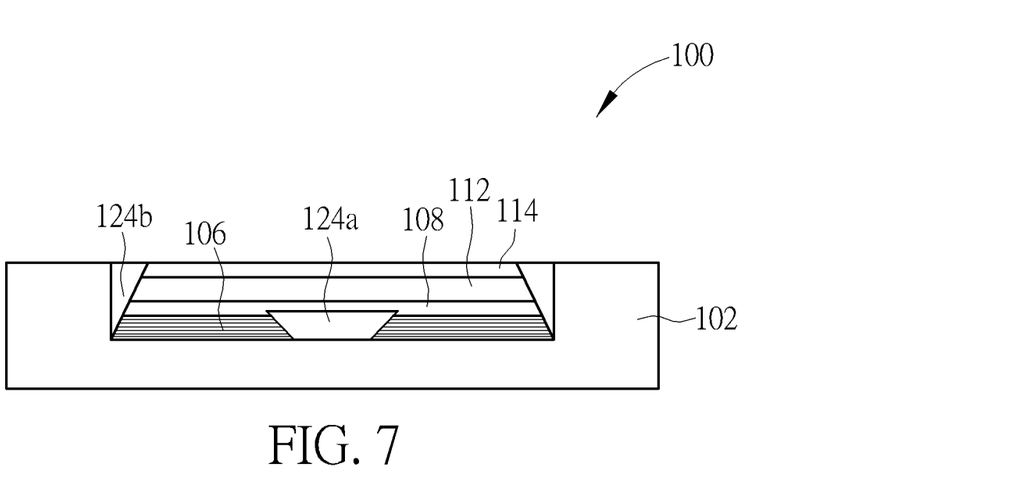
FIG. 7 is a cross-section of the semiconductor epitaxial structure in accordance with another embodiment of the present invention.

Please refer now to FIG. 7. In other embodiment, for example, in the case that tensile stress is generated by the mismatch of lattice structures or coefficients of thermal expansion in entire epitaxial structure, the island insulator 124a and spacer 124b may be modified to be provided with downwardly-tapering feature, as shown in FIG. 7. This kind of feature may be formed by tuning parameters of relevant etch process. In comparison to the embodiment of FIG. 6, contrarily, the island insulator 124a and spacer 124b with downwardly-tapering feature offset the lateral tensile stress from the epitaxial stack, so that fewer defects will be formed and grown in the epitaxial stack and the quality of the layer structures is thereby improved. In the embodiment of present invention, the tapering type of island insulator 124a and spacer 124b would depend on their material composition and actual process or product demand.

Figure 8:
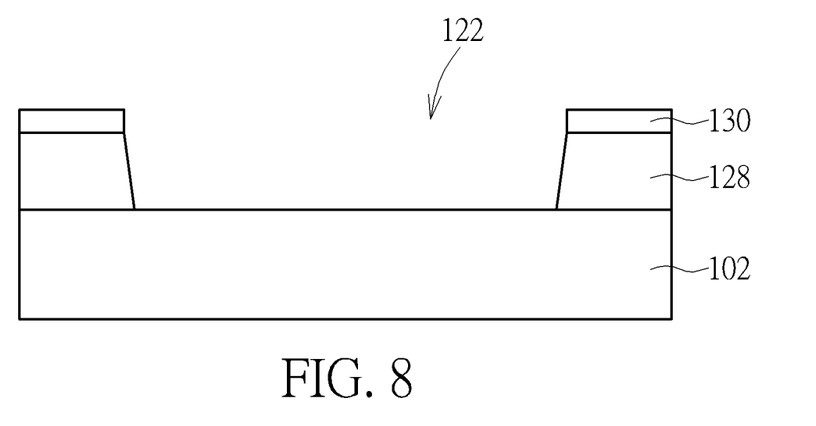
FIGS. 8-11 are schematic cross-sections illustrating steps of fabricating the semiconductor epitaxial structure in accordance with another embodiment of present invention.

Next, please refer to FIGS. 8-11, which illustrate steps of fabricating the semiconductor epitaxial structure according another embodiment of present invention. Similarly, a silicon substrate 102 is provided. What different from FIG. 1 in this embodiment is that the recess 122 is formed in an isolating layer 128 rather than in the substrate 102. As shown in FIG. 8, a photolithography process is performed by using a patterned photoresist 130 to form a recess 122 in the isolating layer 128 and expose the substrate 102.

Figure 9:
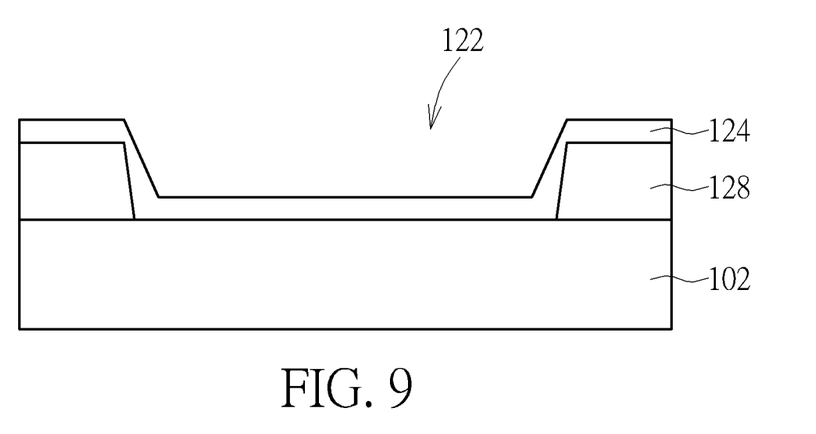

Next, please refer to FIG. 9. After the recess 122 is formed, the photoresist 120 is removed and a silicon oxide layer 124 is formed on entire substrate 102, including the recess 122. In the embodiment of present invention, the silicon oxide layer 124 is provided to form the island insulators and spacer structures in later processes. The silicon oxide layer 124 may be formed by conventional deposition processes, including chemical vapor deposition (CVD), physical vapor deposition (PVD), atomic layer deposition (ALD), high density plasma CVD (HDPCVD), metal organic CVD (MOCVD), plasma enhanced CVD (PECVD), or other applicable processes.

Figure 10:
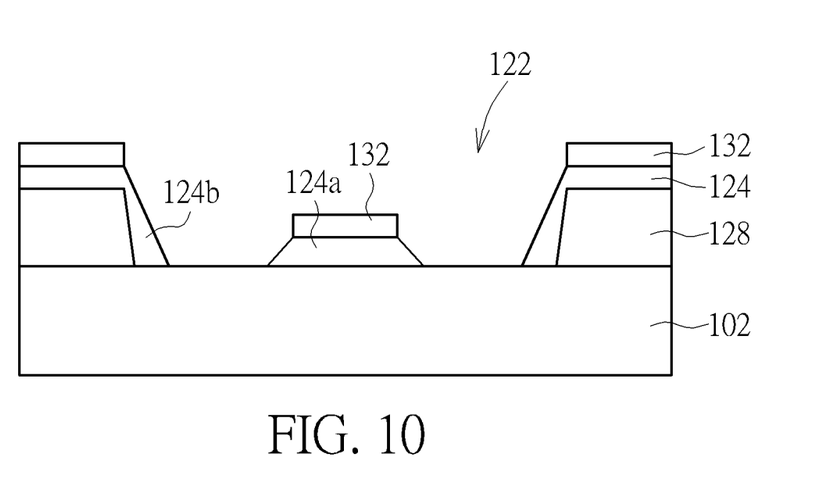

Next, please refer to FIG. 10. After the silicon oxide layer 124 is formed, another patterned photoresist 132 is formed on the silicon oxide layer 124. As shown in figure, a portion of the photoresist 132 is formed on the silicon oxide layer 124 in the recess 122 to define the island insulators that will be formed in later processes, while other portions of the photoresist 132 are formed on the silicon oxide layer 124 outside the recess 122. Please note that, in order to fabricate the spacer structures, this portion of the photoresist 132 doesn't cover the silicon oxide layer 124 on sidewalls of the recess 122. After the photoresist 132 is formed, an etch process is performed to remove the silicon oxide layer 124 not covered by the photoresist 132. In this way, a predetermined island insulator 124a is formed on the middle of the bottom surface of recess 122, and a portion of silicon oxide layer 124 remains on sidewalls of the recess 122 in a spacer form. Please note that in the embodiment of present invention, the parameter of relevant etch process will be tuned to make the etch process with slight isotropic characteristic, so that the island insulator 124a and the spacers 124b formed by the etch process will have upwardly-tapering feature from the substrate 102, as shown in FIG. 10.

Figure 11:
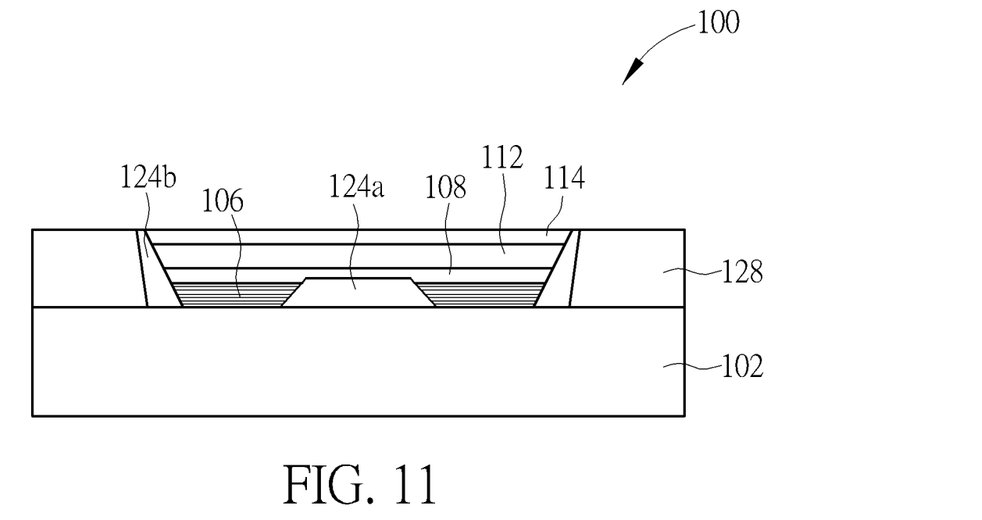

Next, please refer to FIG. 11. After the island insulator 124a and the spacer 124b are formed, layer structures such as buffer layer 110, channel layer 122 and barrier layer 114 are formed sequentially in the recess 122 on the substrate 102, just like the embodiment of FIG. 1. For the simplicity and clarity of drawings, the figures will only show the superlattice stack 106 and the carbon-doped GaN layer 108 among the sub-layer of aforementioned buffer layer 110, and the gate layer 116 will not be shown. Wherein the superlattice stack 106 is formed surrounding the island insulator 124a, while the carbon-doped GaN layer 108 covers over entire island insulator 124a and the superlattice stack 106. These layers may be in-situ formed by epitaxial growth process in the same process chamber. Example of this process includes but not limited to metal organic chemical-vapor deposition (MOCVD), molecular beam epitaxy (MBE) and hydride vapour phase epitaxy (HVPE), etc. On the other hand, in the embodiment of present invention, since the sidewalls of recess 122 are covered by spacer 124b, the buffer layer, the channel layer 112 and the barrier layer 114 are all surrounded by the spacer 124b. Lastly, remove the silicon oxide layer 124 outside the recess, so that the fabrication of semiconductor epitaxial structure 100 is completed.

In the embodiment of present invention, what different from the embodiment of FIG. 6 is that the semiconductor epitaxial structure 100 is formed in an isolating layer 128 rather than in the substrate 102. Through the cooperation with spacer 124b, it may provide better isolation effect between devices, and the purpose of selective epitaxial growth may be achieved by the same processes. Moreover, the isolating layer 128 formed in the process may also be formed with the upwardly-tapering feature like the spacer 124b in the stage of recess etching, to further improve the efficacy of stress releasing.

Figure 12:
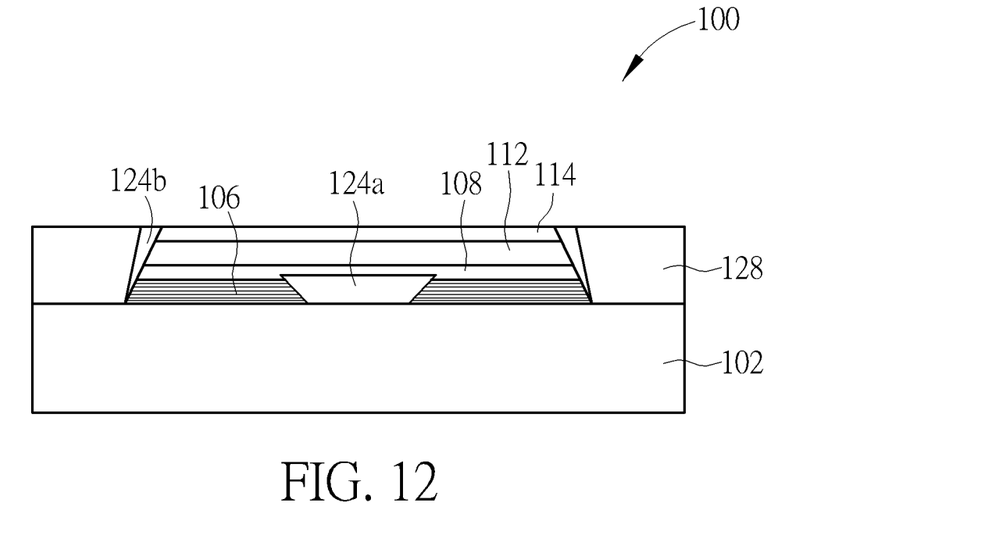
FIG. 12 is a cross-section of the semiconductor epitaxial structure in accordance with another embodiment of the present invention.

Please refer to FIG. 12. In other embodiment, for example, in the case that tensile stress is generated by the mismatch of lattice structures or coefficients of thermal expansion in entire epitaxial structure, the island insulator 124*a* and spacer 124*b* may be modified to be provided with downwardly-tapering feature, as shown in FIG. 12. This kind of feature may be formed by tuning the parameter of relevant etch process. In comparison to the embodiment of FIG. 11, contrarily, the island insulator 124*a* and spacer 124*b* with downwardly-tapering feature offset the lateral tensile stress from the epitaxial stack, so that fewer defects will be formed and grown in the epitaxial stack and the quality of the layer structures is thereby improved. Moreover, the isolating layer 128 formed in the process may also be formed with downwardly-tapering features like the spacer 124*b* in the stage of recess etching, to further improve the efficacy of stress releasing. In the embodiment of present invention, the tapering type of island insulator 124*a*, spacer 124*b* and the isolating layer 128 would depend on their composition and actual demand.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor epitaxial structure with reduced defects, comprising:
   a substrate with a recess formed thereon;
   an island insulator disposed on a bottom surface of said recess;
   spacers disposed on sidewalls of said recess;
   a buffer layer disposed in said recess and covering said island insulator;
   a channel layer disposed in said recess and on said buffer layer; and
   a barrier layer disposed in said recess and on said channel layer, wherein said barrier layer, said channel layer and said buffer layer are surrounded by said spacers, and a two-dimensional electron gas (2DEG) or a two-dimensional hole gas (2DHG) is formed in said channel layer.

2. The semiconductor epitaxial structure with reduced defects of claim 1, wherein said island insulator tapers upwardly from said substrate.

3. The semiconductor epitaxial structure with reduced defects of claim 1, wherein said island insulator tapers downwardly to said substrate.

4. The semiconductor epitaxial structure with reduced defects of claim 1, wherein said spacers taper upwardly from said substrate.

5. The semiconductor epitaxial structure with reduced defects of claim 1, wherein said spacers taper downwardly to said substrate.

6. The semiconductor epitaxial structure with reduced defects of claim 1, wherein said buffer layer comprises a nucleation layer, a superlattice layer and a carbon-doped gallium nitride layer sequentially from bottom to top.

7. The semiconductor epitaxial structure with reduced defects of claim 6, wherein a material of said nucleation layer is aluminum gallium nitride (AlGaN) or aluminum nitride (AlN).

8. The semiconductor epitaxial structure with reduced defects of claim 6, wherein said superlattice layer is a stack of alternating aluminum gallium nitride (AlGaN) layers and gallium nitride (GaN) layers or a stack of alternating aluminum gallium nitride (AlGaN) layers and indium gallium nitride (InGaN) layers.

9. The semiconductor epitaxial structure with reduced defects of claim 1, where a material of said channel layer is undoped gallium nitride (GaN).

10. The semiconductor epitaxial structure with reduced defects of claim 1, where a material of said barrier layer is aluminum gallium nitride (AlGaN).

11. A semiconductor epitaxial structure with reduced defects, comprising:
    a substrate;
    an isolating layer disposed on said substrate, wherein said isolating layer has a recess exposing said substrate;
    an island insulator disposed on said substrate in said recess;
    spacers disposed on sidewalls of said recess;
    a buffer layer disposed in said recess and covering said island insulator;
    a channel layer disposed in said recess and on said buffer layer; and
    a barrier layer disposed in said recess and on said channel layer, wherein said barrier layer, said channel layer and said buffer layer are surrounded by said spacers, and a two-dimensional electron gas (2DEG) or a two-dimensional hole gas (2DHG) is formed in said channel layer.

12. The semiconductor epitaxial structure with reduced defects of claim 11, wherein said island insulator tapers upwardly from said substrate.

13. The semiconductor epitaxial structure with reduced defects of claim 11, wherein said island insulator tapers downwardly to said substrate.

14. The semiconductor epitaxial structure with reduced defects of claim 11, wherein said spacers taper upwardly from said substrate.

15. The semiconductor epitaxial structure with reduced defects of claim 11, wherein said spacers taper downwardly to said substrate.

16. The semiconductor epitaxial structure with reduced defects of claim 11, wherein said buffer layer comprises a nucleation layer, a superlattice layer and a carbon-doped gallium nitride layer sequentially from bottom to top.

17. The semiconductor epitaxial structure with reduced defects of claim 16, wherein a material of said nucleation layer is aluminum gallium nitride (AlGaN) or aluminum nitride (AlN).

18. The semiconductor epitaxial structure with reduced defects of claim 16, wherein said superlattice layer is a stack of alternating aluminum gallium nitride (AlGaN) layers and gallium nitride (GaN) layers or a stack of alternating aluminum gallium nitride (AlGaN) layers and indium gallium nitride (InGaN) layers.

19. The semiconductor epitaxial structure with reduced defects of claim 11, where a material of said channel layer is undoped gallium nitride (GaN).

20. The semiconductor epitaxial structure with reduced defects of claim 11, where a material of said barrier layer is aluminum gallium nitride (AlGaN).

\* \* \* \* \*